United States Patent
Lu et al.

(10) Patent No.: US 9,543,211 B1
(45) Date of Patent: Jan. 10, 2017

(54) SEMICONDUCTOR STRUCTURE AND MANUFACTURING METHOD THEREOF

(71) Applicant: UNITED MICROELECTRONICS CORP., Hsin-Chu (TW)

(72) Inventors: Chia-Lin Lu, Taoyuan (TW);
Chun-Lung Chen, Tainan (TW);
Yu-Cheng Tung, Kaohsiung (TW);
Kun-Yuan Liao, Hsin-Chu (TW);
Feng-Yi Chang, Tainan (TW);
En-Chiuan Liou, Tainan (TW);
Wei-Hao Huang, New Taipei (TW);
Chih-Sen Huang, Tainan (TW);
Ching-Wen Hung, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/864,881

(22) Filed: Sep. 25, 2015

(30) Foreign Application Priority Data

Aug. 28, 2015 (TW) .............................. 104128275 A

(51) Int. Cl.
*H01L 21/70* (2006.01)
*H01L 21/8234* (2006.01)
(Continued)

(52) U.S. Cl.
CPC ..... *H01L 21/823437* (2013.01); *H01L 21/283* (2013.01); *H01L 21/823418* (2013.01); *H01L 27/088* (2013.01)

(58) Field of Classification Search
CPC ................ H01L 21/823814; H01L 21/823828; H01L 21/823871; H01L 2224/13075; H01L 2224/1354; H01L 2224/29075; H01L 2224/2954; H01L 29/41725; H01L 21/82345; H01L 29/42328; H01L 29/42332
(Continued)

(56) References Cited

U.S. PATENT DOCUMENTS 7,419,896 B2   9/2008  Choi
7,994,048 B2   8/2011  Komuro
(Continued)

OTHER PUBLICATIONS

Lu, Title of Invention: Semiconductor Device and Manufacturing Methods Thereof, U.S. Appl. No. 14/841,661, filed Aug. 31, 2015.

*Primary Examiner* — Sonya D McCall Shepard
(74) *Attorney, Agent, or Firm* — Winston Hsu; Scott Margo

(57) ABSTRACT

A manufacturing method of a semiconductor structure includes the following steps. Gate structures are formed on a semiconductor substrate. A source/drain contact is formed between two adjacent gate structures. The source/drain contact is recessed by a recessing process. A top surface of the source/drain contact is lower than a top surface of the gate structure after the recessing process. A stop layer is formed on the gate structures and the source/drain contact after the recessing process. A top surface of the stop layer on the source/drain contact is lower than the top surface of the gate structure. A semiconductor structure includes the semiconductor substrate, the gate structures, a gate contact structure, and the source/drain contact. The source/drain contact is disposed between two adjacent gate structures, and the top surface of the source/drain contact is lower than the top surface of the gate structure.

17 Claims, 10 Drawing Sheets

(51) Int. Cl.
*H01L 21/283* (2006.01)
*H01L 27/088* (2006.01)

(58) Field of Classification Search
USPC . 438/233, 652–660, 586–600; 257/399–402,
E21.575, E21.615–636
See application file for complete search history.

(56) References Cited

U.S. PATENT DOCUMENTS

| | | |
|---|---|---|
| 8,187,969 B2 | 5/2012 | Kim |
| 9,029,920 B2 | 5/2015 | Xie |
| 2013/0181265 A1 | 7/2013 | Grasshoff |
| 2014/0077305 A1* | 3/2014 | Pethe ................ H01L 21/76895 |
| | | 257/368 |
| 2015/0130073 A1 | 5/2015 | Sung |

* cited by examiner

SEMICONDUCTOR STRUCTURE AND MANUFACTURING METHOD THEREOF

BACKGROUND OF THE INVENTION

1. Field of the Invention

The present invention relates to a semiconductor structure and a manufacturing method thereof, and more particularly, to a semiconductor structure including a source/drain contact recessed by a recessing process for improving the process window and a manufacturing method thereof.

2. Description of the Prior Art

The development of semiconductor integrated circuit technology progresses continuously and circuit designs in products of the new generation become smaller and more complicated than those of the former generation. The amount and the density of the functional devices in each chip region are increased constantly according to the requirements of innovated products, and the size of each device has to become smaller accordingly. As shown in FIG. 1, in a traditional semiconductor structure 100, a plurality of gates 130 are disposed on a substrate 110, a gate protection layer 131 is formed on each of the gates 130, and a self-aligned contact structure 141 is formed between two adjacent gates 130. The self-aligned contact structure 141 is formed by filling an opening formed between the two adjacent gates 130 with a conductive material and performing a chemical mechanical polish (CMP) process, and the self-aligned contact structure 141 may be formed corresponding to a source/drain (not shown) between the gates 130. The self-aligned contact structure 141 is electrically isolated from the gates 130. After the CMP process mentioned above, top surfaces of the self-aligned contact structure 141, the gate protection layer 131, and a first gate contact 142 formed on another gate 130 are kept on the same level and leveled with one another. A second gate contact 160 is then formed to be connected to the first gate contact. The second gate contact 160 tends to contact the self-aligned contact structure 141 and a short circuit may occur between the self-aligned contact structure 141 and the gate 130 when there is an alignment shift in the process of forming the second gate contact 160 because the spacing between the gates 130 becomes smaller. Therefore, the process window is a problem to be improved.

SUMMARY OF THE INVENTION

A manufacturing method of a semiconductor structure is provided in an embodiment of the present invention. The manufacturing method includes the following steps. Gate structures are formed on a semiconductor substrate. A source/drain contact is formed between two adjacent gate structures. The source/drain contact is recessed by a recessing process. A top surface of the source/drain contact is lower than a top surface of the gate structure after the recessing process. A stop layer is formed on the gate structures and the source/drain contact after the recessing process. A top surface of the stop layer on the source/drain contact is lower than the top surface of the gate structure.

A semiconductor structure is provided in an embodiment of the present invention. The semiconductor structure includes a semiconductor substrate, a plurality of gate structures, a gate contact structure, and a source/drain contact. The gate structures are disposed on the semiconductor substrate. The gate contact structure is disposed on one of the gate structure. The gate contact structure is electrically connected to the gate structure. The source/drain contact is disposed between two adjacent gate structures, and a top surface of the source/drain contact is lower than a top surface of the gate structure.

In the semiconductor structure and the method thereof in the present invention, the process window of the subsequently formed gate contact may be improved because the top surface of the source/drain contact is lower than the top surface of the gate structure after the recessing process. The short circuit between the source/drain contact and the gate structure may be avoided accordingly, and the manufacturing yield may be enhanced.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 2-8 are schematic drawings illustrating a manufacturing method of a semiconductor structure according to a first embodiment of the present invention, wherein FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5.

FIG. 7 is a schematic drawing in a step subsequent to FIG. 6, and

FIG. 8 is a schematic drawing in a step subsequent to FIG. 7.

FIG. 9 and FIG. 10 are schematic drawings illustrating a manufacturing method of a semiconductor structure according to a second embodiment of the present invention, wherein FIG. 10 is a schematic drawing in a step subsequent to FIG. 9.

DETAILED DESCRIPTION

Figure 1:
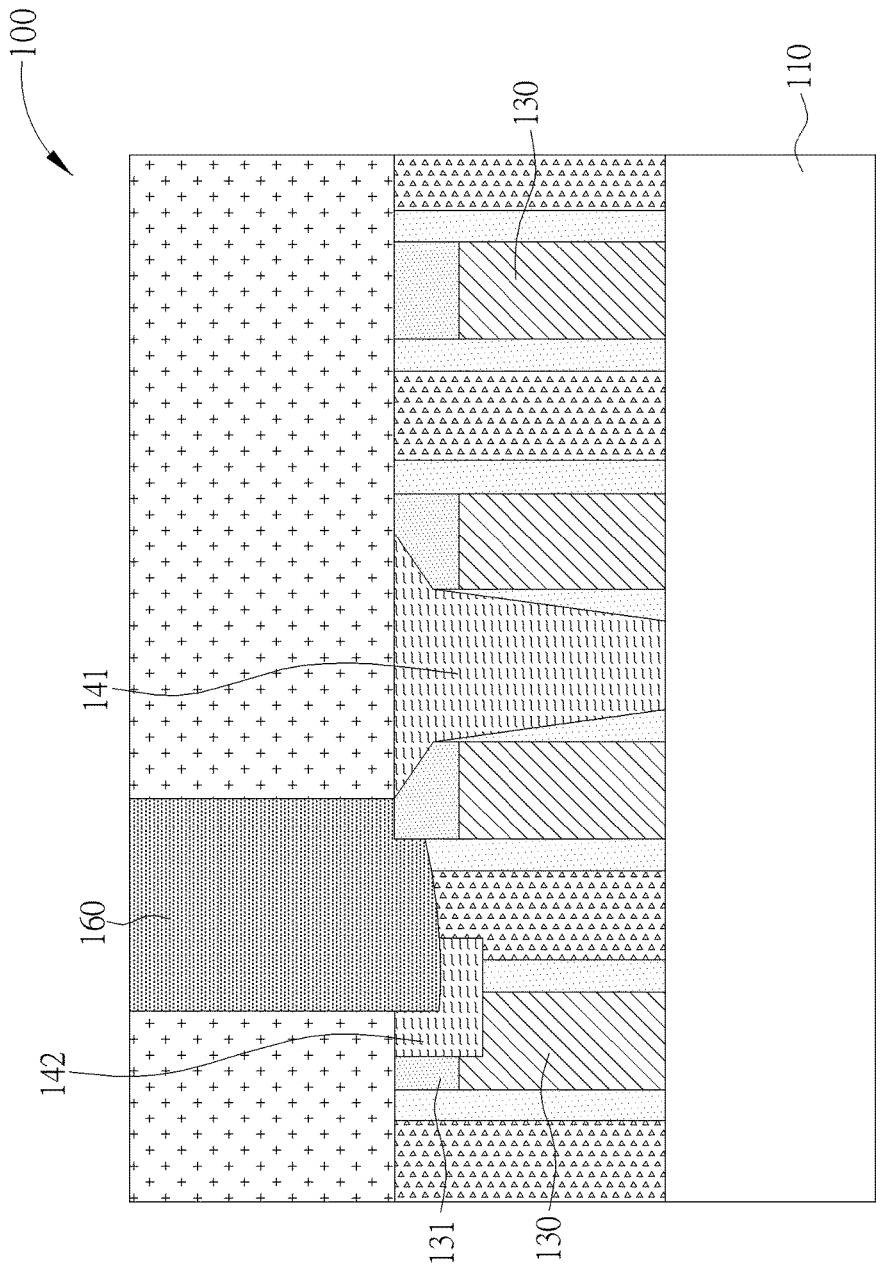
FIG. 1 is a schematic drawing illustrating a traditional semiconductor structure.
Figure 2:
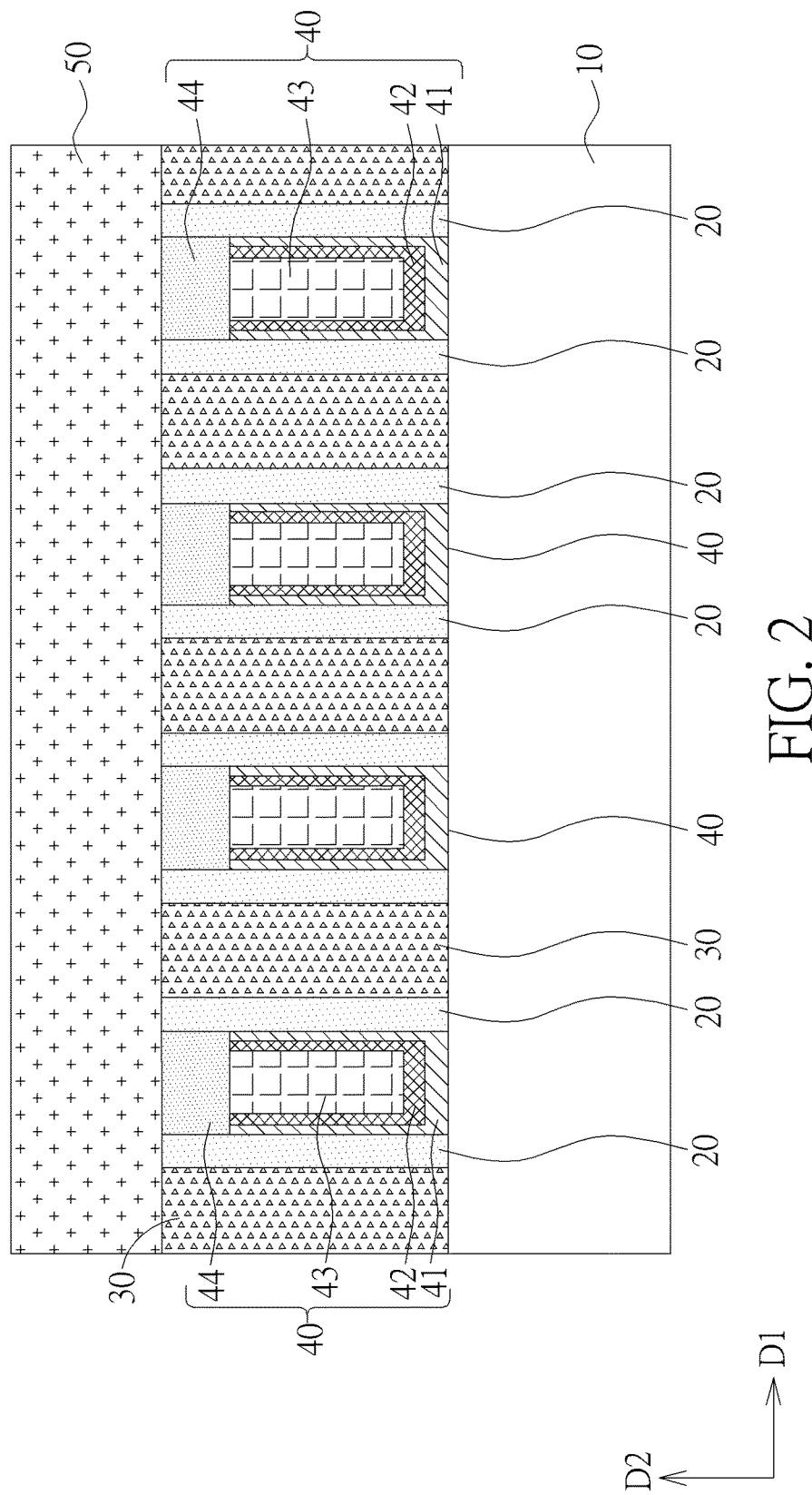

Please refer to FIGS. 2-8. FIGS. 2-8 are schematic drawings illustrating a manufacturing method of a semiconductor structure according to a first embodiment of the present invention. The manufacturing method of the semiconductor structure in this embodiment includes the following steps. As shown in FIG. 2, gate structures 40 are formed on a semiconductor substrate 10. The semiconductor substrate 10 may include a silicon substrate, an epitaxial silicon substrate, a silicon germanium substrate, a silicon carbide substrate, or a silicon-on-insulator (SOI) substrate, but not limited thereto. The semiconductor substrate 10 may also have a fin structure (not shown) according to other considerations, and the gate structures 40 may be formed on the fin structure of the semiconductor substrate 10. In this embodiment, the gate structures 40 may be aligned in a first direction D1 and separated from one another by a first dielectric layer 30. For example, the gate structures 40 in this embodiment may be formed by a replacement metal gate (RMG) process, but not limited thereto. In this situation, each of the gate structures 40 may include a high-k dielectric layer 41, a barrier layer 42, a metal gate 43, and a capping layer 44 stacked bottom-up. The capping layer 44 is disposed on the metal gate 43, and the capping layer is formed by an insulating material preferably, but the present invention is not limited to this. In other embodiments of the present invention, the gate structure 40 may be formed by other manufacturing methods and/or the gate structure 40 may be composed of other different structures according to other considerations. In this embodiment, a sidewall spacer 20 may be formed on sidewalls of each gate structure 40. The sidewall spacer 20, the first dielectric layer 30, and the gate structures 40 may have the same height in a vertical second direction D2 by a planarization process. In addition, other required material layers such as a contact etching stop layer (CESL, not shown) may also be selectively formed between the gate structures 40 according to other considerations, but not limited thereto. A hard mask layer 50 may then be formed to cover the sidewall spacer 20, the first dielectric layer 30, and the gate structures 40.

Figure 3:
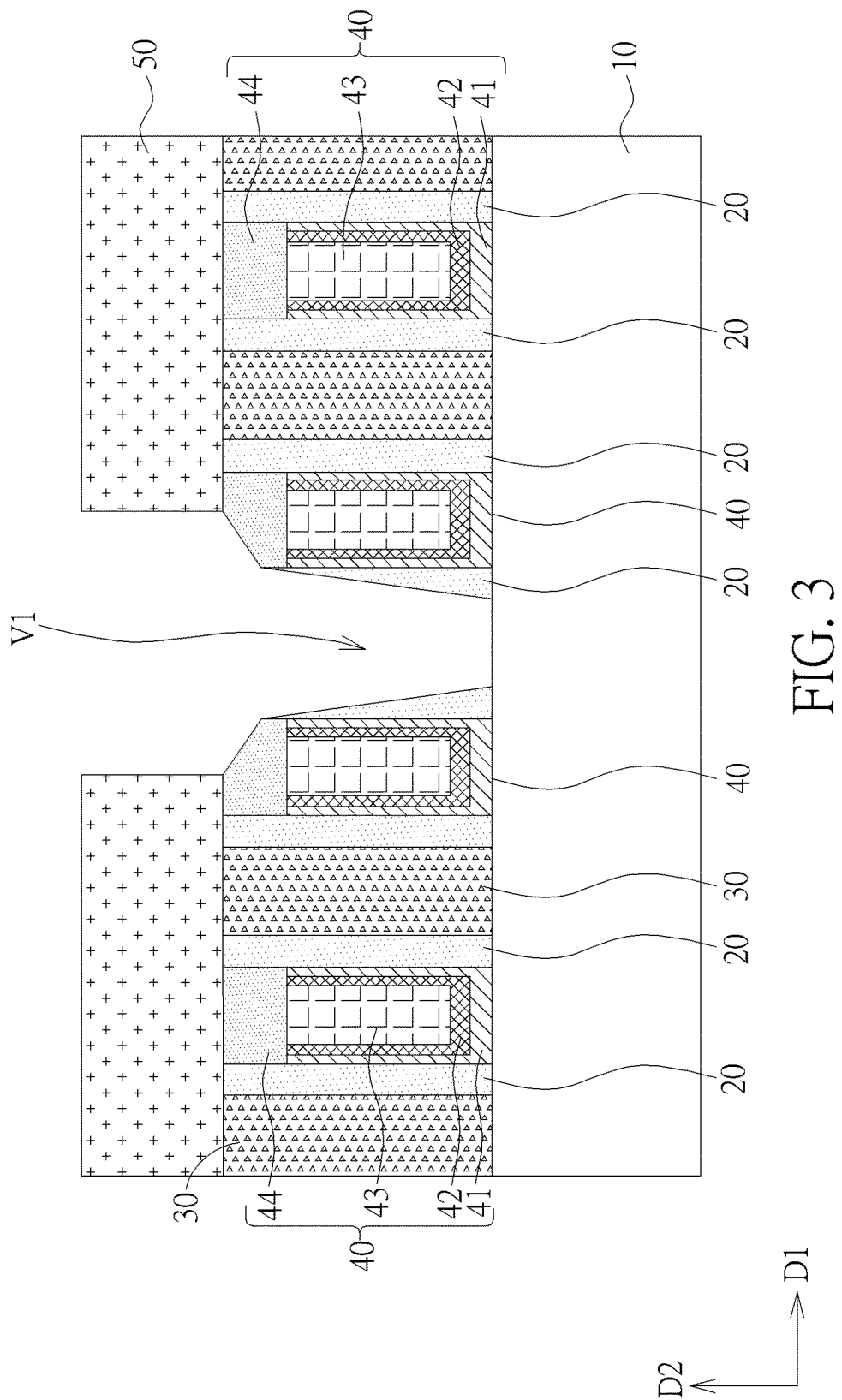

As shown in FIG. 3, the hard mask layer 50 may be patterned by a patterned photoresist layer (not shown), and a first opening V1 is then formed between two adjacent gate structures 40. In this embodiment, the first opening V1 penetrates the first dielectric layer 30 between the two adjacent gate structures 40 and exposes a part of the semiconductor substrate 10, and a source/drain structure (not shown) such as a source/drain doped region may be formed in the semiconductor substrate 10 exposed by the first opening V1, but not limited thereto. In other embodiments of the present invention, the source/drain structure may also be formed on the semiconductor substrate between the two adjacent gate structures 40 and covered by the first dielectric layer 30, and the first opening V1 may penetrate the first dielectric layer 30 for exposing at least a part of the source/drain structure. In other words, the first opening V1 in this embodiment may be formed corresponding to the source/drain structure, and the source/drain structure may include an epitaxial layer, a silicide layer, a doped region in the semiconductor substrate 10, or other suitable types of source/drain structures. The first opening V1 may be formed self-aligned by a patterning process (such as an etching process) with the hard mask layer 50 because the source/drain structure is disposed between the two adjacent gate structures 40 and a width of an aperture pattern in the hard mask layer 50 for forming the first opening V1 is larger than the spacing between the two adjacent gate structures 40 in the first direction D1.

Figure 4:
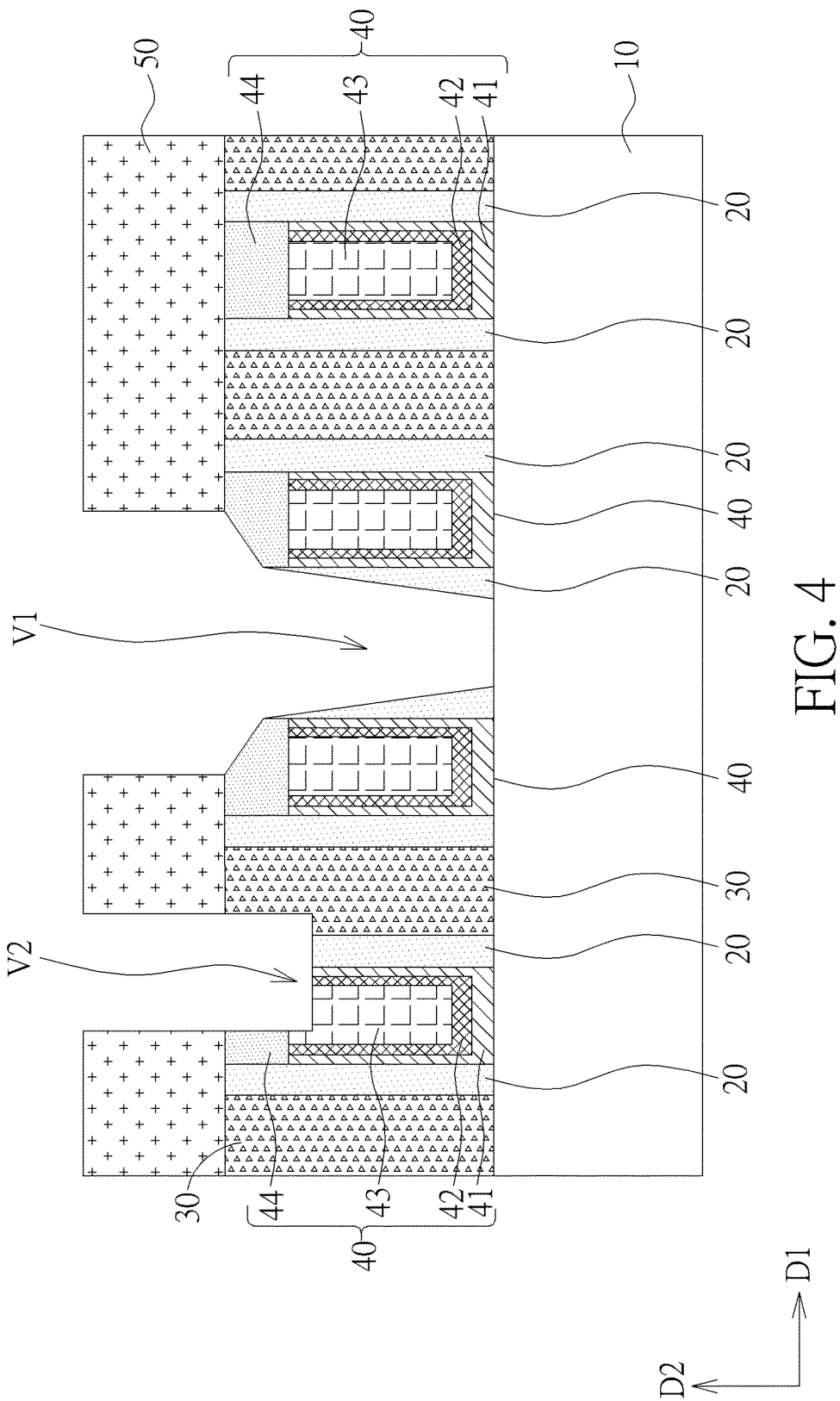

As shown in FIG. 4, the hard mask layer 50 may be further patterned by another patterned photoresist layer (not shown) for forming a second opening V2 on one of the gate structures 40, and the second opening V2 exposes a part of the gate structure 40. In this embodiment, the second opening V2 at least penetrates the capping layer 44 and exposes the metal gate 43 of the corresponding gate structure 40. Additionally, the second opening V2 in this embodiment is formed after the step of forming the first opening V1 preferably because the depth of the second opening V2 and the material layers to be removed for forming the second opening V2 are different from those of the first opening V1, but the present invention is not limited to this. In other embodiments of the present invention, the second opening V2 may also be formed before the step of forming the first opening V1, or the first opening V1 and the second opening V may be formed at the same time according to other considerations.

Figure 5:
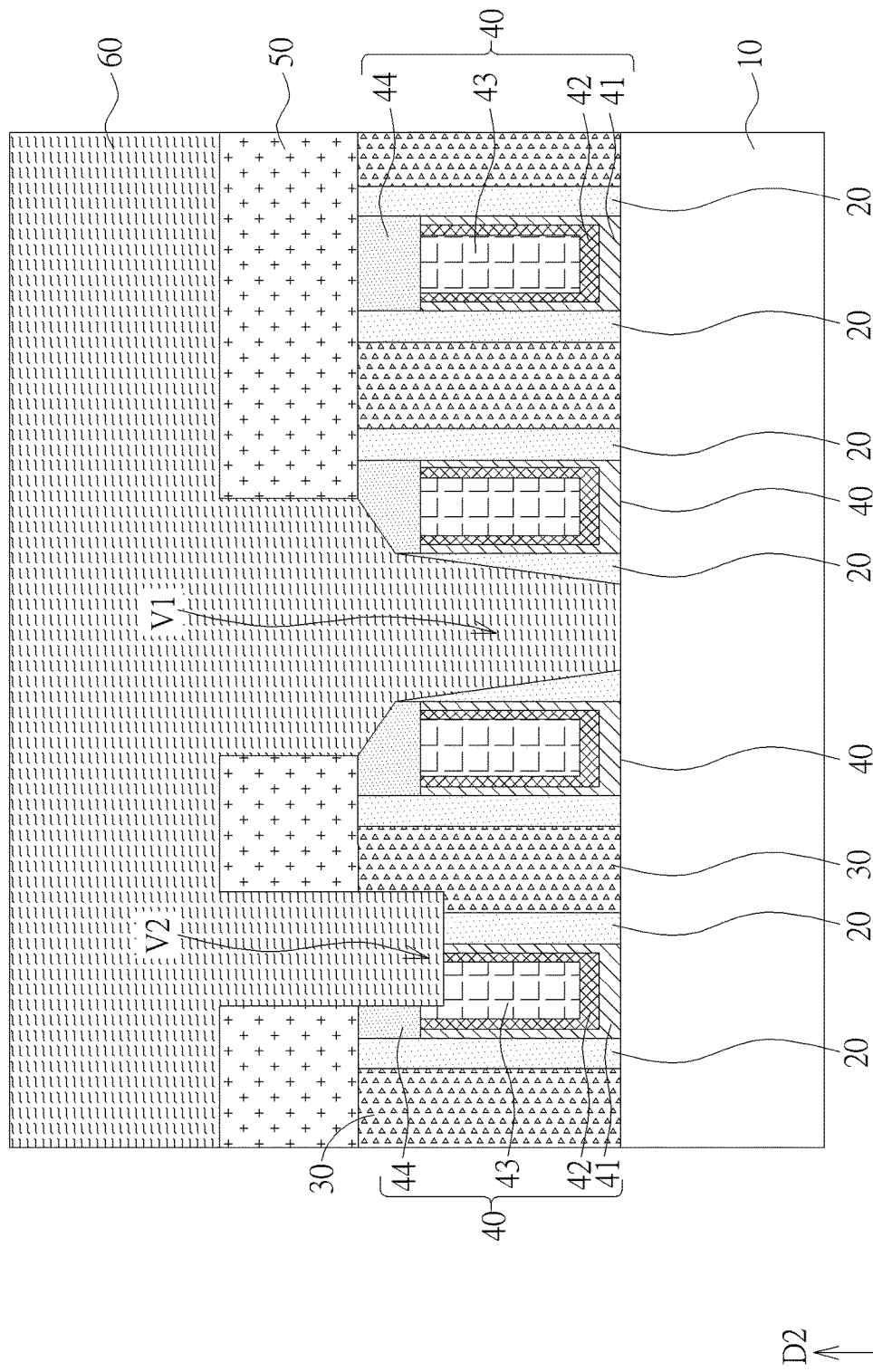
Figure 6:
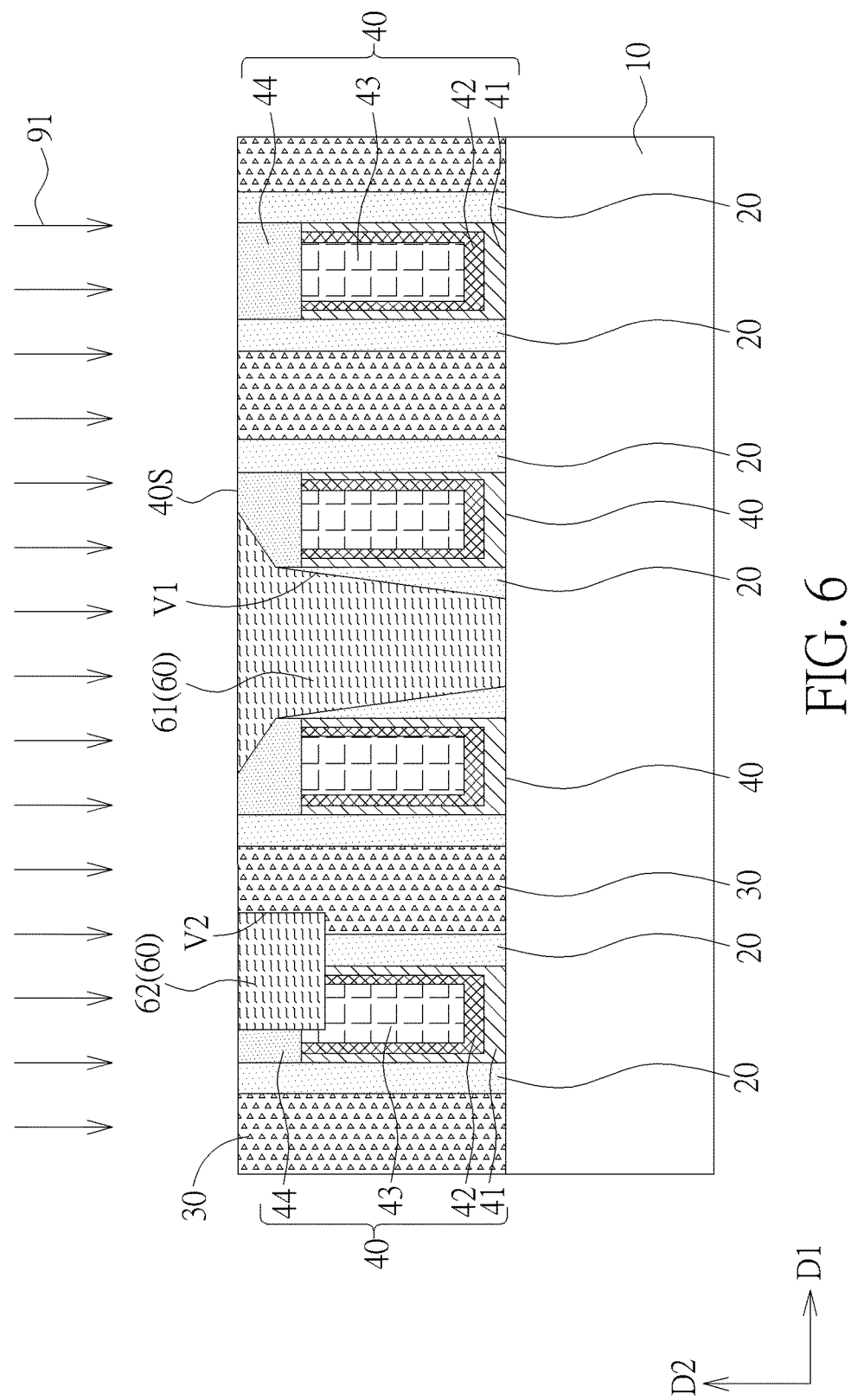

As shown in FIG. 5, a conductive material such as a first conductive material 60 shown in FIG. 5 may then be formed, and the first opening V1 and the second opening V2 are filled with the first conductive material 60. In this embodiment, the first opening V1 and the second opening V2 are completely filled with the first conductive material 60 preferably, but not limited thereto. The first conductive material 60 may include metal conductive materials such as aluminum (Al), tungsten (W), copper (Cu), titanium aluminide (TiAl), titanium (Ti), titanium nitride (TiN), tantalum (Ta), tantalum nitride (TaN), and titanium aluminum oxide (TiAlO) or other suitable conductive materials. The first conductive material 60 maybe generally regarded as metal zero (M0), but not limited thereto. For example, the first conductive material 60 may include a main conductive material formed by tungsten, aluminum, or copper, and a barrier layer formed by titanium nitride or tantalum nitride, but not limited thereto. As shown in FIG. 5 and FIG. 6, a planarization process 91 such as a chemical mechanical polish (CMP) process is then performed for removing a part of the first conductive material 60 and forming a source/drain contact 61 in the first opening V1 between the two adjacent gate structures 40 and a lower gate contact 62 in the second opening V2. In other words, the source/drain contact 61 and the lower gate contact 62 maybe formed by an identical conductive material such as the metal zero, but not limited thereto. Additionally, the hard mask layer 50 may also be removed by the planarization process 91 in this embodiment, but at least a part of the hard mask layer 50 may also remain in other embodiments of the present invention according to other considerations. It is worth noting that the forming method of the source/drain contact 61 in the present invention is not limited to the approaches described above, and other suitable approaches may also be applied to form the source/drain contact 61.

Figure 7:
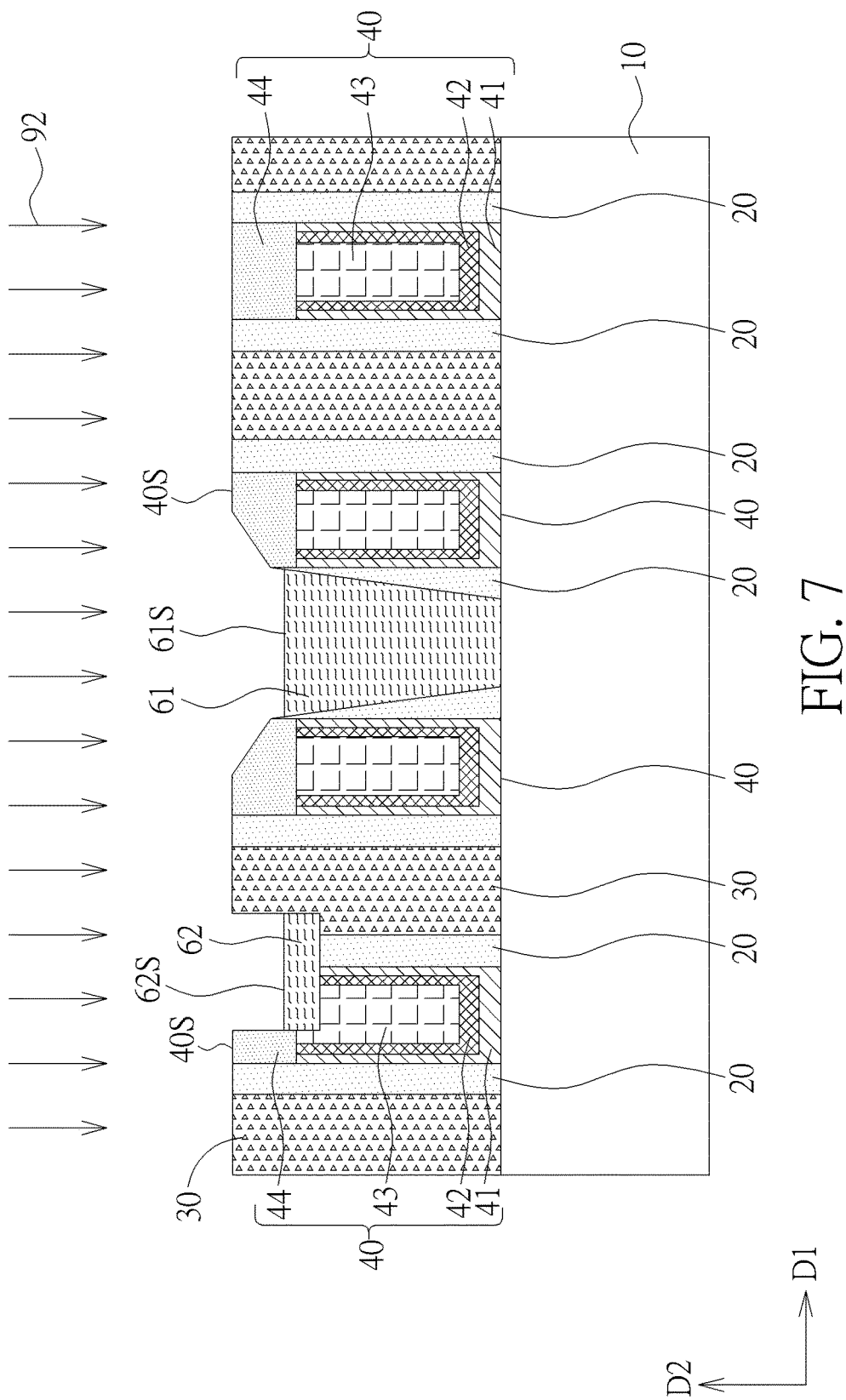

As shown in FIG. 6 and FIG. 7, a recessing process 92 is then performed to recess the source/drain 61 after the planarization process 91. The recessing process 92 may include an etching back process with higher etching selectivity to the first conductive material 60, but not limited thereto. The recessing process 92 is configured to recess the surface of the source/drain contact 61, and a top surface of the source/drain contact 61 (such as a first top surface 61S shown in FIG. 7) is lower than a top surface of the gate structure 40 (such as a second top surface 40S shown in FIG. 7) after the recessing process 92. It is worth noting that the top surfaces mentioned in the present invention are defined as the topmost surfaces of the parts in the second direction D2, and the top surface of the gate structure 40 includes the top surface of the capping layer 44 (such as the second top surface 40S) accordingly. Additionally, the recessing process 92 may also generate recessing effects on the surface of the lower gate contact 62. In other words, the lower gate contact 62 may also be recessed by the recessing process 92, and a top surface of the lower gate contact 62 (such as a third top surface 62S shown in FIG. 7) is lower than the second top surface 40S of the gate structure 40 after the recessing process 92. In this embodiment, the first top surface 61S and the third top surface 62S may have similar depths and/or heights, but the present invention is not limited thereto. In other embodiments of the present invention, there may be a difference in height between the third top surface 62S of the lower gate contact 62 and the first top surface 61S of the source/drain contact 61 by modifying the process parameters of the recessing process 92 and/or other suitable processes according to other considerations.

Figure 8:
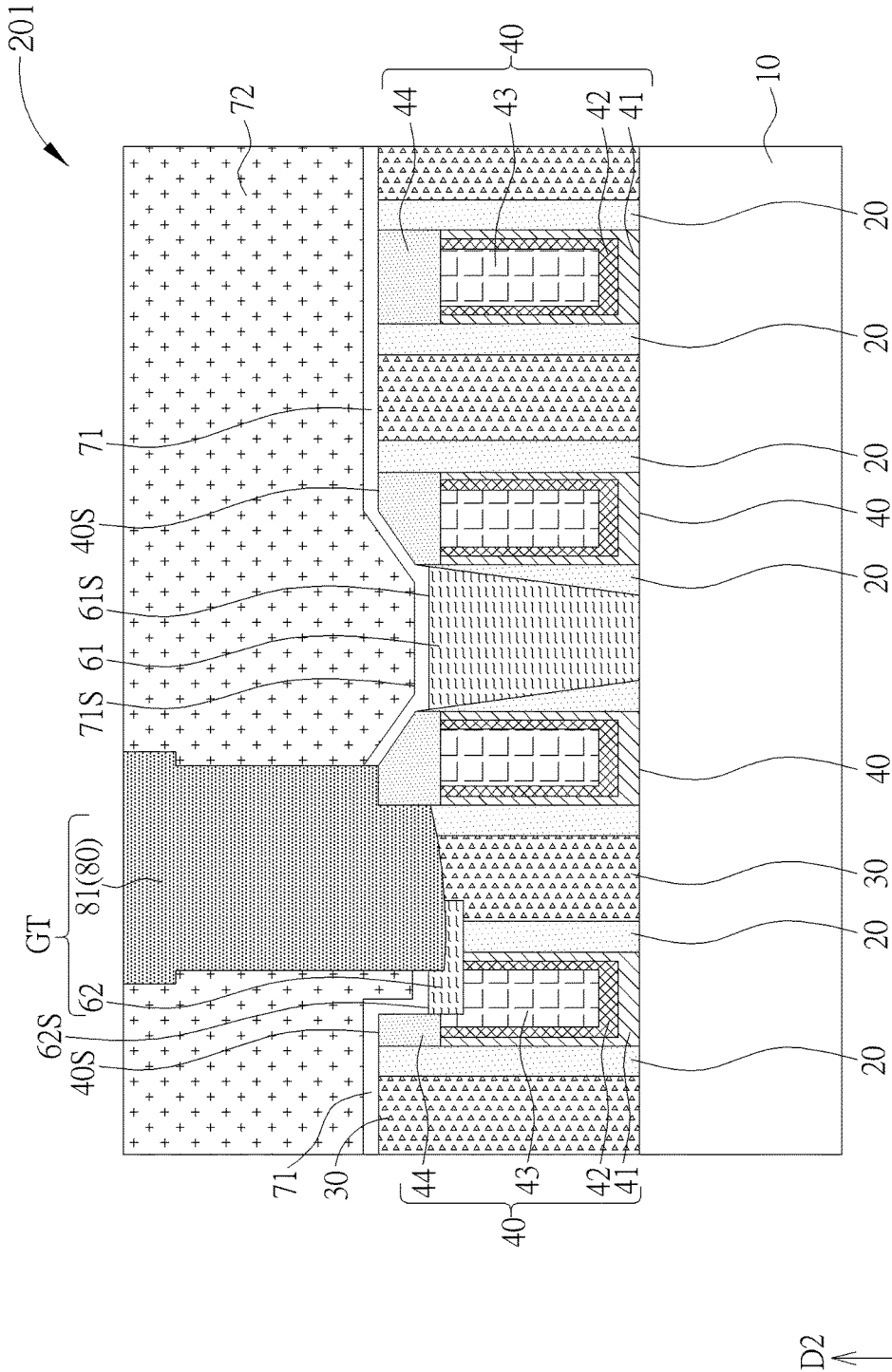

As shown in FIG. 7 and FIG. 8, a stop layer 71 is formed on the gate structures 40 and the source/drain contact 61 after the recessing process 92. The materials of the stop layer 71 may include silicon nitride (SiN), silicon oxynitride (SiON), or other suitable insulating materials. It is worth noting that the stop layer 71 may be conformally formed on the gate structures 40 and the source/drain contact 61 preferably, and a top surface of the stop layer 71 (such as a fourth top surface 71S shown in FIG. 8) on the source/drain contact 61 is lower than the second top surface 40S of the gate structure 40. Additionally, a part of the stop layer 71 is further formed on the lower gate contact 62, and the fourth top surface of the stop layer 71 on the lower gate contact 62 is lower than the second top surface 40S of the gate structure 40. In addition, the manufacturing method in this embodiment may further include forming a dielectric layer (such as a second dielectric layer 72 shown in FIG. 8) on the stop layer 71 and forming an upper gate contact 81 penetrating the stop layer 71 and the second dielectric layer 72 on the lower gate contact 62 so as to connect the upper gate contact 81 and the lower gate contact 62 and form a gate contact structure GT. The upper gate contact 81 may be formed by a second conductive material 80, and the second conductive material 80 may include metal conductive materials such as aluminum, tungsten, copper, titanium aluminide, titanium, titanium nitride, tantalum, tantalum nitride, and titanium aluminum oxide or other suitable conductive materials. The second conductive material 80 may be generally regarded as metal one (M1), but not limited thereto. The second conductive material 80 may include a main conductive material formed by tungsten, aluminum, or copper, and a barrier layer formed by titanium nitride or tantalum nitride, but not limited thereto. Additionally, the first dielectric layer 30 and the second dielectric layer 72 may include silicon oxide, silicon nitride, silicon oxynitride, or other suitable insulating materials respectively.

A semiconductor structure 201 shown in FIG. 8 may be obtained by the manufacturing method described above. Therefore, the semiconductor structure 201 includes the semiconductor substrate 10, a plurality of the gate structures 40, the gate contact structure GT, and the source/drain contact 61. The gate structures 40 are disposed on the semiconductor substrate 10. The gate contact structure GT is disposed on one of the gate structure 40. The gate contact structure GT is electrically connected to the gate structure 40. The source/drain contact 61 is disposed between two adjacent gate structures 40, and the top surface of the source/drain contact 61 (such as the first top surface 61S) is lower than the top surface of the gate structure 40 (such as the second top surface 40S). The gate contact structure GT includes the lower gate contact 62 and the upper gate contact 81. The upper gate contact 81 is disposed on the lower gate contact 62, and the top surface of the lower gate contact 62 (such as the third top surface 62S) is lower than the top surface of the gate structure 40 (such as the second top surface 40S). The gate structure 40 includes the metal gate 43 and the capping layer 44. The capping layer 44 is disposed on the metal gate 43, and the top surface of the gate structure 40 includes the top surface of the capping layer 44. Other possible components of the gate structure 40 are detailed in the manufacturing method mentioned above and will not be redundantly described. Additionally, the semiconductor structure 201 in this embodiment may further include the sidewall spacer 20, the first dielectric layer 30, the stop layer 71, and the second dielectric layer 72 mentioned in the manufacturing method described above. The stop layer 71 is disposed on the source/drain contact 61 and the gate structures 40. The top surface of the stop layer 71 (such as the fourth top surface 71S) on the source/drain contact 61 is lower than the top surface of the gate structure 40 (such as the second top surface 40S). In addition, a part of the stop layer 71 may be further disposed on the lower gate contact 62, and the top surface of the stop layer 71 (such as the fourth top surface 71S) on the lower gate contact 62 is lower than the top surface of the gate structure 40 (such as the second top surface 40S). The second dielectric layer 72 is disposed on the stop layer 71, and the upper gate contact 81 penetrates the second dielectric layer 72 and the stop layer 71 on the lower gate contact 62 for being connected to the lower gate contact 62.

It is worth noting that, according to the manufacturing method of this embodiment, the first top surface 61S of the source/drain contact 61 is lower than the second top surface 40S of the gate structure 40 by performing the recessing process, and the short circuit between the upper gate contact 81 and the source/drain contact 61 may be avoided when an alignment shift happens in the step of forming the upper gate contact 81 subsequently, such as the condition of the upper gate contact 81 shown in FIG. 8 which is shifted toward the source/drain contact 61 in the first direction D1. Accordingly, the manufacturing method in this embodiment may be used to improve the process window of the manufacturing step of forming the upper gate contact 81, and the related manufacturing yield may be therefore enhanced.

Figure 9:
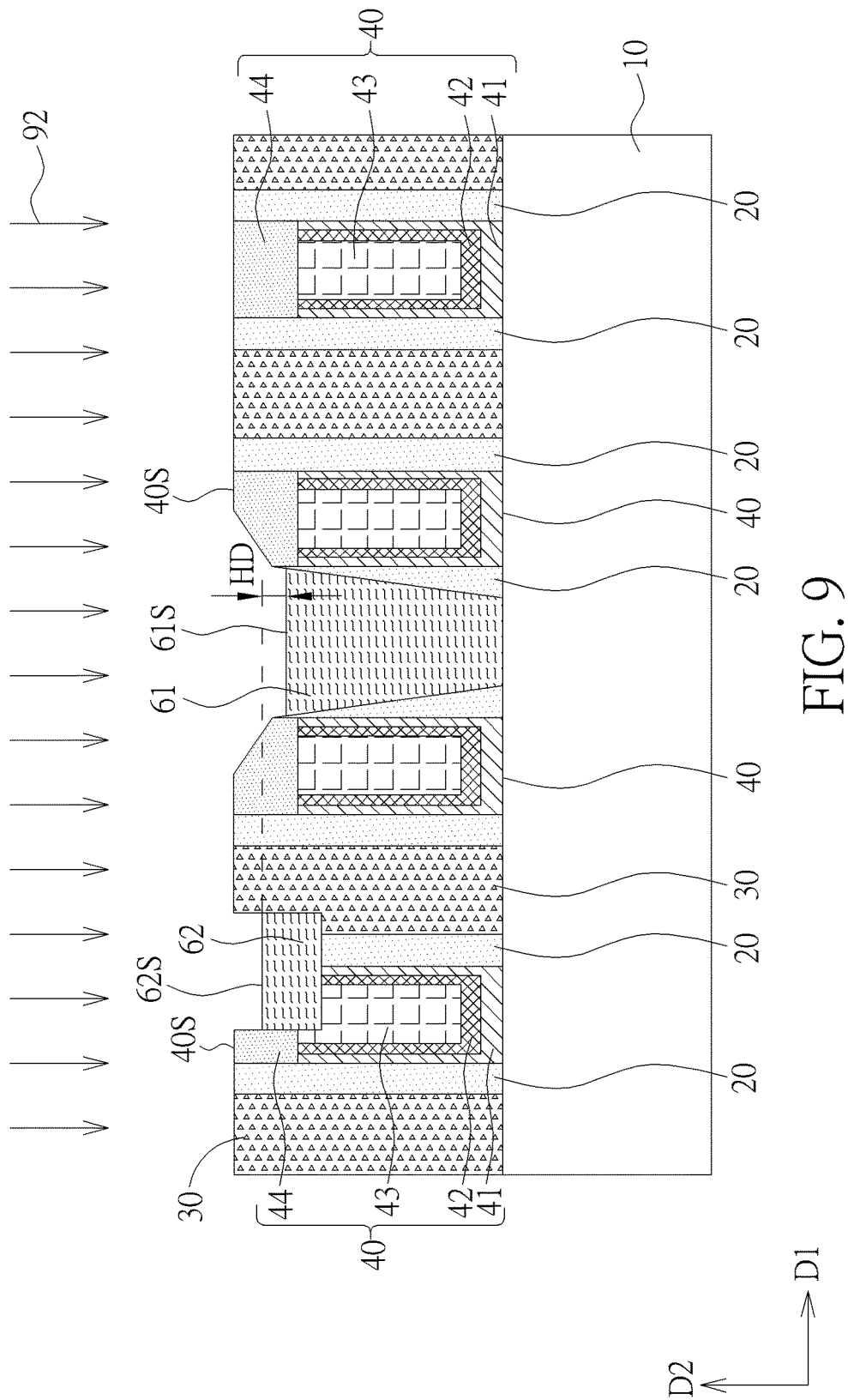
Figure 10:
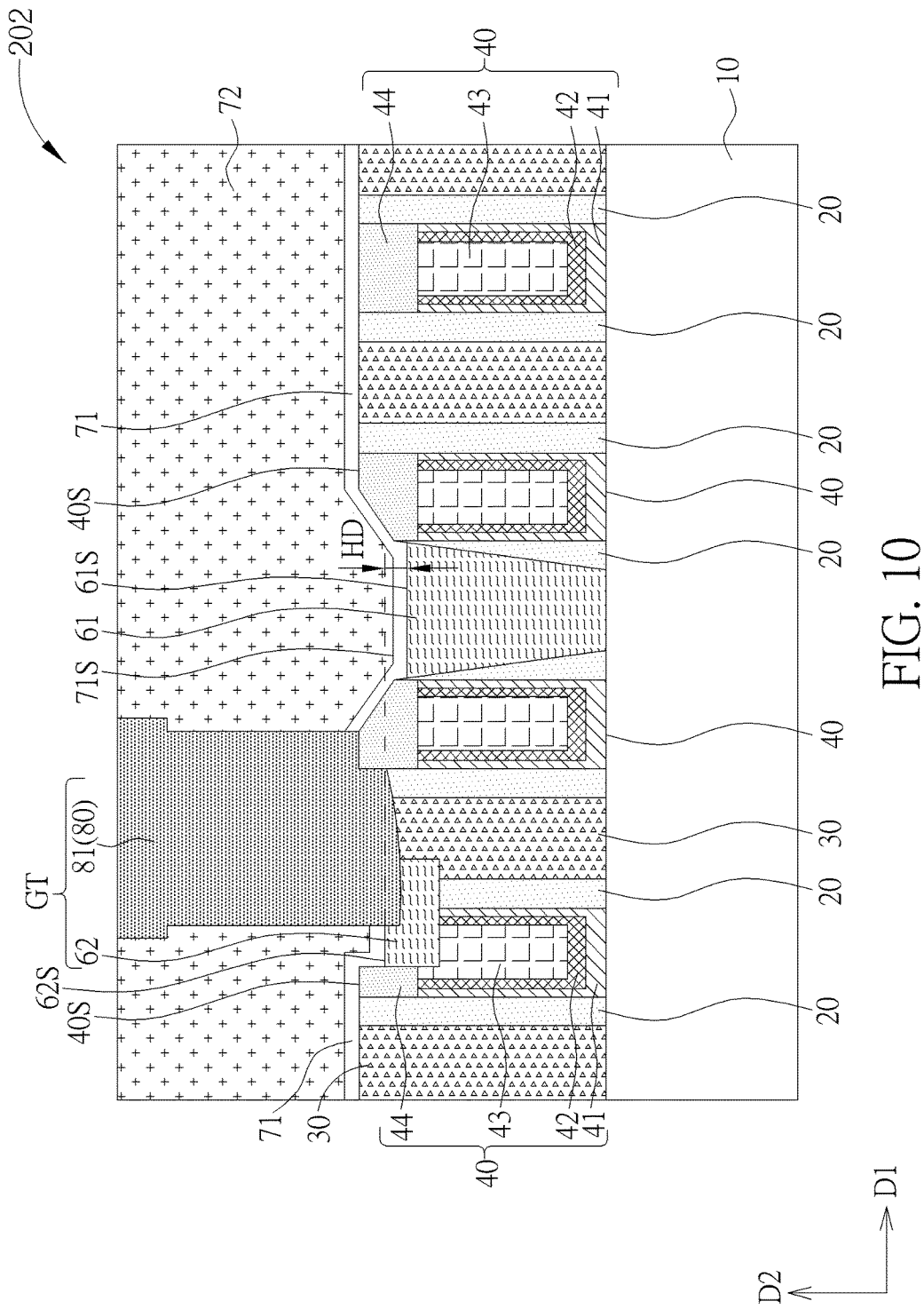

Please refer to FIG. 9 and FIG. 10. FIG. 9 and FIG. 10 are schematic drawings illustrating a manufacturing method of a semiconductor structure according to a second embodiment of the present invention. As shown in FIG. 9 and FIG. 10, the difference between the manufacturing method in this embodiment and the first embodiment described above is that the top surface of the source/drain contact 61 (such as the first top surface 61S) is lower than the top surface of the lower gate contact 62 (such as the third top surface 62S) after the recessing process 92. A difference in height HD exists between the first top surface 61S and the third top surface 63S in the second direction D2, and the required depth in the step of forming the upper gate contact 81 may be reduced relatively. The opportunity of forming a connection between the upper gate contact 81 and the source/drain contact 61 may be further reduced, and the process window and the production yield may be further improved accordingly. For example, a mask (such as a patterned photoresist, not shown) may be formed on the lower gate contact 62 first, an etching process is then performed to etch the source/drain contact 61, and the first top surface 61S of the source/drain contact 61 may become lower than the third top surface 62S of the lower gate contact 62 after performing the recessing process 92. In another approach, a relatively thinner mask (not shown) may be formed on the lower gate contact 62 before the recessing process 92, and the first top surface 61S of the source/drain contact 61 may become lower than the third top surface 62S of the lower gate contact 62 after the recessing process 92 because the actual etching time of the source/drain contact 61 in the recessing process 92 is longer than the actual etching time of the lower gate contact 62.

To summarize the above descriptions, in the manufacturing method of the semiconductor structure of the present invention, the process window of the subsequently formed upper gate contact may be improved because the top surface of the source/drain contact is lower than the top surface of the gate structure after the recessing process. The short circuit between the source/drain contact and the gate structure may be avoided accordingly, and the manufacturing yield may be enhanced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of a semiconductor structure, comprising:
    forming a plurality of gate structures on a semiconductor substrate;
    forming a source/drain contact between two adjacent gate structures;
    recessing the source/drain contact by a recessing process, wherein a top surface of the source/drain contact is lower than a top surface of the gate structure after the recessing process;
    forming a stop layer on the gate structures and the source/drain contact after the recessing process, wherein a top surface of the stop layer on the source/drain contact is lower than the top surface of the gate structure; and
    forming a lower gate contact and an upper gate contact on one of the gate structures, wherein the upper gate contact is formed on the lower gate contact, the lower gate contact and the upper gate contact are electrically connected to the gate structure, and a top surface of the lower gate contact is lower than the top surface of the gate structure.

2. The manufacturing method of claim 1, wherein the step of forming the source/drain contact comprises:
    forming a first opening between the two adjacent gate structures;
    forming a conductive material, wherein the first opening is filled with the conductive material; and
    performing a planarization process for removing a part of the conductive material and forming the source/drain contact between the two adjacent gate structures, wherein the planarization process is performed before the recessing process.

3. The manufacturing method of claim 2, further comprising:
    forming a second opening on one of the gate structure, wherein the second opening exposes a part of the gate structure, and the second opening is filled with the conductive material,
    wherein the lower gate contact is formed in the second opening after the planarization process.

4. The manufacturing method of claim 3, wherein the second opening is formed after the step of forming the first opening.

5. The manufacturing method of claim 3, wherein the lower gate contact is recessed by the recessing process.

6. The manufacturing method of claim 5, wherein the top surface of the source/drain contact is lower than the top surface of the lower gate contact after the recessing process.

7. The manufacturing method of claim 5, wherein a part of the stop layer is further formed on the lower gate contact after the recessing process, and the top surface of the stop layer on the lower gate contact is lower than the top surface of the gate structure.

8. The manufacturing method of claim 7, further comprising:
    wherein the upper gate contact penetrates the stop layer on the lower gate contact, and the upper gate contact is connected to the lower gate contact.

9. The manufacturing method of claim 8, further comprising:
    forming a dielectric layer on the stop layer, wherein the upper gate contact penetrates the dielectric layer and the stop layer on the lower gate contact for being connected to the lower gate contact.

10. The manufacturing method of claim 1, wherein the gate structure comprises a metal gate and a capping layer, the capping layer is formed on the metal gate, and the top surface of the gate structure comprises a top surface of the capping layer.

11. A semiconductor structure, comprising:
    a semiconductor substrate;
    a plurality of gate structures disposed on the semiconductor substrate;
    a gate contact structure disposed on one of the gate structures, wherein the gate contact structure is electrically connected to the gate structure; and
    a source/drain contact disposed between two adjacent gate structures, wherein a top surface of the source/drain contact is lower than a top surface of the gate structure, wherein the gate contact structure comprises a lower gate contact and an upper gate contact disposed on the lower gate contact, and a top surface of the lower gate contact is lower than the top surface of the gate structure.

12. The semiconductor structure of claim 11, wherein the top surface of the source/drain contact is lower than the top surface of the lower gate contact.

13. The semiconductor structure of claim 11, further comprising:
    a stop layer disposed on the source/drain contact and the gate structures, wherein a top surface of the stop layer on the source/drain contact is lower than the top surface of the gate structure.

14. The semiconductor structure of claim 13, wherein a part of the stop layer is further disposed on the lower gate contact, and the top surface of the stop layer on the lower gate contact is lower than the top surface of the gate structure.

15. The semiconductor structure of claim 14, wherein the upper gate contact penetrates the stop layer on the lower gate contact for being connected to the lower gate contact.

16. The semiconductor structure of claim 15, further comprising a dielectric layer disposed on the stop layer, wherein the upper gate contact penetrates the dielectric layer and the stop layer on the lower gate contact for being connected to the lower gate contact.

17. The semiconductor structure of claim 11, wherein the gate structure comprises a metal gate and a capping layer, the capping layer is disposed on the metal gate, and the top surface of the gate structure comprises a top surface of the capping layer.

* * * * *